(12) United States Patent
Wu et al.

(10) Patent No.: US 8,628,990 B1
(45) Date of Patent: Jan. 14, 2014

(54) IMAGE DEVICE AND METHODS OF FORMING THE SAME

(71) Applicant: Taiwan Semiconductor Manufacturing Company, Ltd., Hsin-Chu (TW)

(72) Inventors: Cheng-Ta Wu, Shueishang Township (TW); Sheng-Chieh Chiao, Hsin-Chu (TW); Yeur-Luen Tu, Taichung (TW); Chia-Shiung Tsai, Hsin-Chu (TW); Shuang-Ji Tsai, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/629,317

(22) Filed: Sep. 27, 2012

(51) Int. Cl.
 *H01L 21/00* (2006.01)
(52) U.S. Cl.
 USPC ............... 438/48; 438/69; 438/70; 438/795
(58) Field of Classification Search
 USPC .................... 438/48, 70, 73, 75, 69, 795
 See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,037,804 B2 | 5/2006 | Kellar et al. | |
| 7,056,807 B2 | 6/2006 | Kellar et al. | |
| 7,087,538 B2 | 8/2006 | Staines et al. | |
| 7,128,426 B2 * | 10/2006 | Watanabe | 353/122 |

(Continued)

*Primary Examiner* — Julia Slutsker
(74) *Attorney, Agent, or Firm* — Slater & Matsil, L.L.P.

(57) ABSTRACT

A photodetector is formed in a front surface of a substrate. The substrate is thinned from a back surface of the substrate. A plurality of dopants is introduced into the thinned substrate from the back surface. The plurality of dopants in the thinned substrate is annealed. An anti-reflective layer is deposited over the back surface of the thinned substrate. A micro lens is formed over the anti-reflective layer. At least one ultraviolet (UV) radiation treatment is performed after at least one of the preceding steps.

19 Claims, 9 Drawing Sheets

(56) References Cited

U.S. PATENT DOCUMENTS

| | | |
|---|---|---|
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,586,685 B2 * | 9/2009 | Dunn et al. .................. 359/619 |
| 7,652,821 B2 * | 1/2010 | Boettiger et al. ............ 359/619 |
| 7,834,450 B2 | 11/2010 | Kang |
| 2009/0035889 A1 * | 2/2009 | Hwang ........................ 438/70 |
| 2009/0212397 A1 * | 8/2009 | Tuttle ........................... 257/618 |
| 2012/0175636 A1 * | 7/2012 | Ihara ............................ 257/77 |
| 2012/0193741 A1 * | 8/2012 | Borthakur et al. ........... 257/433 |

* cited by examiner

IMAGE DEVICE AND METHODS OF FORMING THE SAME

TECHNICAL FIELD

This disclosure relates to an image sensor device and methods for forming an image sensor device.

BACKGROUND

An image sensor device is one of the building blocks in a digital imaging system such as a digital still or video camera. An image sensor device includes a pixel array (or grid) for detecting light and recording intensity (brightness) of the detected light. The pixel array responds to the light by accumulating a charge—for example, the more light, the higher the charge. The accumulated charge is then used (for example, by other circuitry) to provide a color and brightness signal for use in a suitable application, such as a digital camera. One type of image sensor device is a backside illuminated (BSI) image sensor device. BSI image sensor devices are used for sensing a volume of light projected towards a backside surface of a substrate (which supports the image sensor circuitry of the BSI image sensor device). The pixel grid is located at a front side of the substrate, and the substrate is thin enough so that light projected towards the backside of the substrate can reach the pixel grid. BSI image sensor devices provide a reduced destructive interference, as compared to front-side illuminated (FSI) image sensor devices.

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the image sensor devices.

Due to device scaling, improvements to image sensor device technology are continually being made to further improve image quality of image sensor devices. Although existing image sensor devices and methods of fabricating image sensor devices have been generally adequate for their intended purposes, as device scaling down continues, they have not been entirely satisfactory in all respects.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components are arrangements are described below to simplify the present disclosure. These are, of course, merely examples and are not intended to be limiting. Moreover, the formation of a first feature over a second feature in the description that follows may include embodiments in which the first and second features are formed in direct contact, and may also include embodiment in which additional features may be formed interposing the first and second features, such that the first and second features may not be in direct contact. Further still, references to relative terms such as "top", "front", "bottom", and "back" are used to provide a relative relationship between elements and are not intended to imply any absolute direction. Various features may be arbitrarily drawn in different scales for simplicity and clarity.

Figure 1:
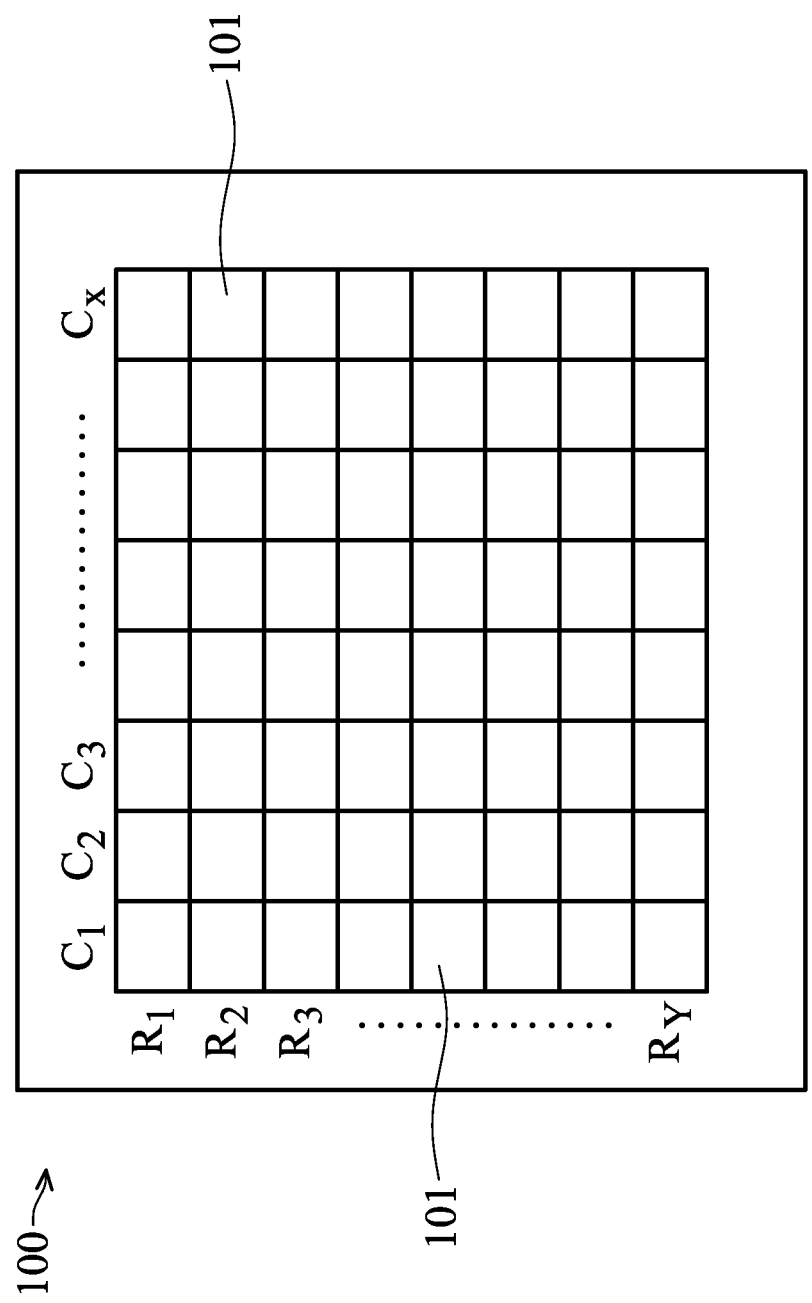
FIG. 1 is a top view of an image sensor device according to various embodiments of this disclosure.

FIG. 1 is a top view of an image sensor device 100 according to various aspects of the present disclosure. In the depicted embodiment, the image sensor device is a backside illuminated (BSI) image sensor device. The image sensor device 100 includes an array of pixel regions 101. Each pixel region 101 is arranged into a column (for example, $C_1$ to $C_x$) and a row (for example, $R_1$ to $R_y$). The term "pixel region" refers to a unit cell containing features (for example, a photodetector and various circuitry), which may include various semiconductor devices for converting electromagnetic radiation to an electrical signal. Photodetectors in the pixel regions 101 may include photodiodes, complimentary metal-oxide-semiconductor (CMOS) image sensors, charged coupling device (CCD) sensors, active sensors, passive sensors, and/or other sensors. The pixel regions 101 may be designed having various sensor types. For example, one group of pixel regions 101 may be CMOS image sensors and another group of pixel regions 101 may be passive sensors. In the depicted embodiment, each pixel region 101 may include a photodetector, such as a photogate-type photodetector, for recording an intensity or brightness of light (radiation). Each pixel region 101 may also include various semiconductor devices, such as various transistors including a transfer transistor, a reset transistor, a source-follower transistor, a select transistor, some other suitable transistor, or combinations thereof. Additional circuitry, inputs, and/or outputs may be in a periphery region of the image sensor device 100. Those circuitry, inputs, and/or outputs in the periphery region are coupled to the pixel regions 101 to provide an operation environment for the pixel regions 101 and support external communications with the pixel regions 101. For simplicity, an image sensor device including a single pixel region is described in the present disclosure; however, typically an array of such pixel regions may form the image sensor device 100 illustrated in FIG. 1.

Figure 2:
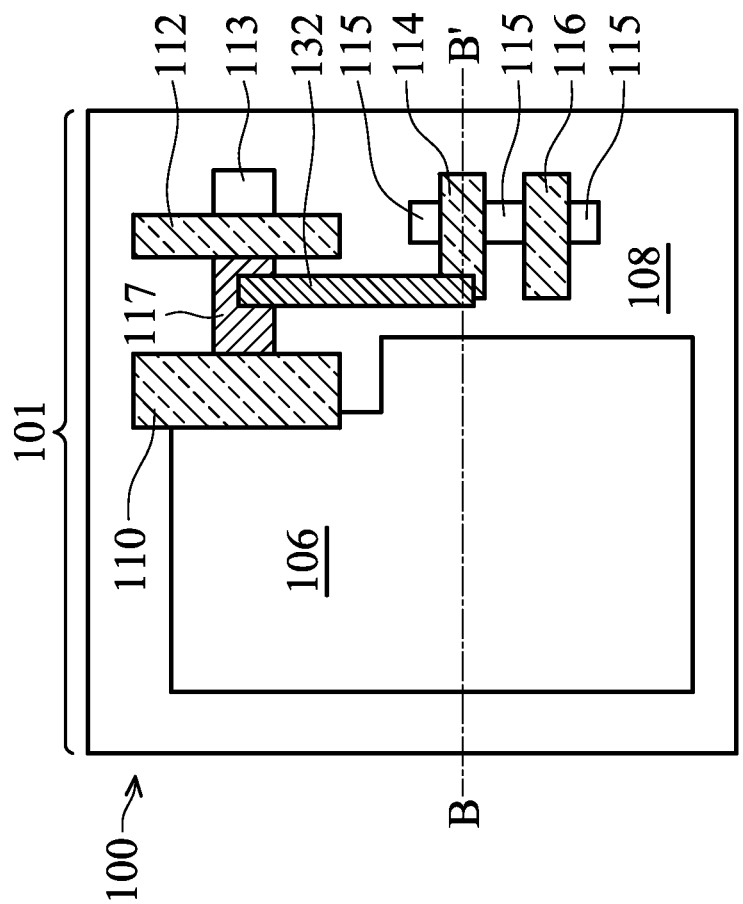
FIG. 2 is an enlarged top view of a pixel region in the image sensor device of FIG. 1.

FIG. 2 is an enlarged top view of a pixel region 101 in the image sensor device 100 on a front surface of a substrate (not illustrated in FIG. 2). The pixel region 101 refers to a unit cell containing at least one photodetector 106 and various circuitry for converting electromagnetic radiation to an electrical signal. In the depicted embodiment, the photodetector 106 includes a photodiode for recording an intensity or brightness of light (radiation). The pixel region 101 may contain various transistors including a transfer transistor 110, a reset transistor 112, a source-follower transistor 114, a select transistor 116, or other suitable transistors, or combinations thereof. The pixel region 101 may also include various doped regions in the substrate, for example doped region 113, 115 and 117. The doped regions 113, 115 and 117 are configured as source/drain regions of previously mentioned transistors. The doped region 1117 is also referred as a floating diffusion region 117. The floating diffusion region 117 is between the transfer transistor 110 and the reset transistor 112, and is one of the source/drain regions for transfer transistor 110 and the reset transistor 112. A conductive feature 132 overlaps a portion of a gate stack of the source-follower transistor 114 and connects to the floating diffusion region 117. The image sensor device 100 also includes various isolation features 108 formed in the substrate to isolate various regions of the substrate to prevent leakage currents between various regions. In some embodiments, the isolation features includes dielectric isolation features formed by a shallow trench isolation (STI) technique. In certain embodiments, the isolation features may include doped isolation features formed by an implantation technique. In the depicted embodiment, an isolation feature 108 is formed in the pixel region 101 to isolate the photodetector 106, the transfer transistor 110, the reset transistor 112, the source-follower transistor 114 and the select transistor 116. The image sensor device 100 further includes a color filter (not shown) and a lens (not shown) disposed over a back surface of the substrate. The color filter and the lens are aligned with the photodetector 106.

In operation of the image sensor device 100 according to one or more embodiments, the image sensor device 100 is designed to receive radiation traveling towards the back surface of the substrate. The lens disposed over the back surface of the substrate directs the incident radiation to the corresponding photodetector 106 in the substrate. The incident radiation generates electron-hole pairs. When exposed to the incident radiation, the photodetector 106 responds to the incident radiation by accumulating electrons. The holes are trapped by a doped layer over the back surface of the substrate to prevent the re-combination of the electrons and the holes. The electrons are transferred from the photodetector 106 to the floating diffusion region 117 when the transfer transistor 110 is turned on. Through the connection of the conductive feature 132, the source-follower transistor 114 may convert the electrons from the floating diffusion region 117 to voltage signals. The select transistor 116 may allow a single row of the pixel array to be read by read-out electronics. The reset transistor 112 acts as a switch to reset the floating diffusion region 117. When the reset transistor 112 is turned on, the floating diffusion region 117 is effectively connected to a power supply clearing all accumulated electrons.

Figure 3:
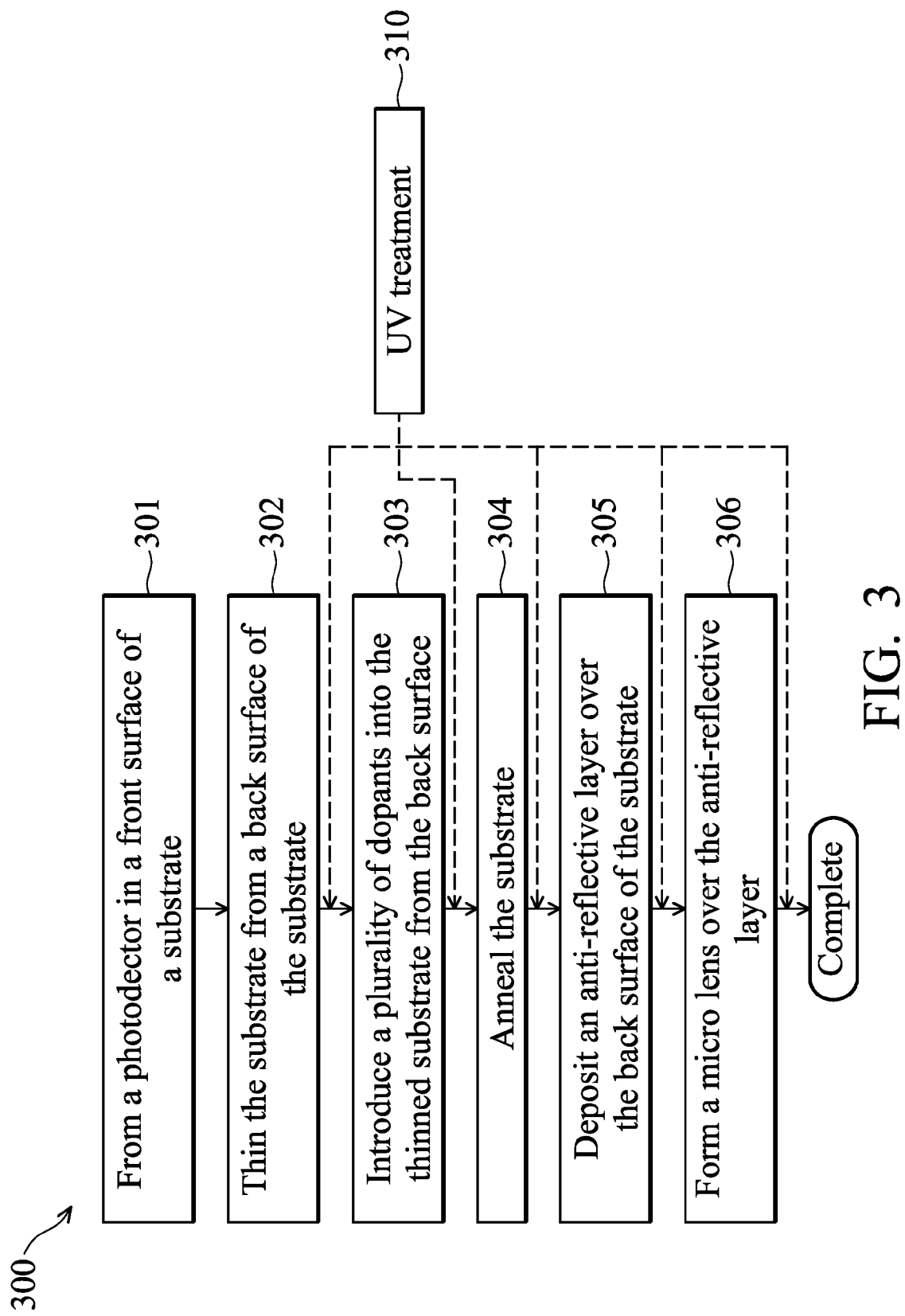
FIG. 3 is a flowchart of a method of forming an image sensor device according to one or more embodiments of this disclosure.

FIG. 3 is a flowchart of a method 300 of forming an image sensor device according to one or more embodiments of this disclosure. The flowchart of the method 300 begins, at operation 301, with a substrate that has a front surface and a back surface, wherein a photodetector is formed in the front surface within a pixel region of the substrate. In at least one embodiment, forming the photodetector within the pixel region includes forming a light-sensing region along the front surface of the substrate and forming a doped pinned layer overlapping the light-sensing region at the front surface of the substrate. The forming of the light-sensing region may include introducing a first conductivity type of dopants from the front surface of the substrate. The forming of the doped pinned layer may include introducing a second conductivity type of dopants opposite to the first conductivity type from the front surface into the light-sensing region. Next, the method 300 continues with operation 302 in which the substrate is thinned from the back surface of the substrate. In at least one embodiment, a planarization process, such as a chemical mechanical polishing (CMP) process, is applied to the back surface of the substrate to reduce a thickness of the substrate. The method 300 continues with operation 310 in which an ultraviolet (UV) radiation treatment is (optionally) performed over the back surface of the thinned substrate. In some embodiments, the UV radiation treatment has a wavelength ranging from about 200 nm to about 410 nm. The UV radiation treatment includes an operation energy ranging from about 3 joule (J) to about 150 J; an operation intensity ranging from about 35 mW/cm$^2$ to about 70 mW/cm$^2$; and an operation temperature ranging from about 50° C. to about 120° C.

The method 300 continues with operation 303 in which dopants are introduced into the thinned substrate from the back surface. In some embodiments, the dopants are implanted from the back surface into the thinned substrate. The dopants have the second conductivity type as the doped pinned layer. In the certain embodiments, the UV radiation treatment (operation 310) is (optionally) performed after operation 303. The method 300 continues with operation 304 in which an anneal process is performed over the thinned substrate. In the certain embodiments, the UV radiation treatment (operation 310) is (optionally) performed after operation 304. The method 300 continues with operation 305 in which an anti-reflective layer is formed over the back surface of the thinned substrate. In the certain embodiments, the UV radiation treatment (operation 310) is (optionally) performed after operation 305. The method 300 continues with operation 306 in which a micro lens is formed over the anti-reflective layer. In the certain embodiments, the UV radiation treatment (operation 310) is (optionally) performed after operation 306. Further, it is understood that additional steps can be provided before, during, and after the method 300. For example, the method 300 may further include forming a solder bump or copper bump after operation 306 to complete the forming of an image sensor device.

During the processes in method 300, positive charges may accumulate on the back surface of the substrate. The positive charges may penetrate through the substrate near the photodetectors. The positive charges attract the electrons in electron-hole pairs from the incident radiation before the electrons arrive at the photodetectors. A dark current (current that flows in the image sensor device in absence of incident light on the image sensor device) and a white pixel (where an excessive amount of current leakage causes an abnormally high signal from the pixel) may result. By applying the UV radiation treatment (operation 310), the positive charges are released by gaining enough energy acquired from the UV radiation to surmount the energy barrier for electron exciting. The UV radiation treatment (operation 310) may release the positive charges and generate negative charges over the back surface of the substrate. The negative charges attract the holes in electron-hole pairs from the incident radiation to prevent the re-combination of the electrons and the holes. More electrons are collected by the photodetectors and are converted to voltage signals. Hence, the phenomenon of dark current or white pixel is reduced. The device performance is thus improved.

According to one or more embodiments of this disclosure, the method 300 includes performing at least one UV radiation treatment (operation 310) after at least one of the operations 302, 303, 304, 305 or 306. In certain embodiments, the method 300 performs one UV radiation treatment (operation 310) after introducing a plurality of dopants into the thinned substrate from the back surface (operation 303) while performing the UV radiation treatment after the operations 302, 304 to 306 is optional. In some embodiments, the method 300 includes more than one UV radiation treatment (operation 310). In at least one embodiment, the method 300 performs UV radiation treatments (operation 310) after both operations 303 and 306. Note that, although only a single UV radiation treatment operation 310 is depicted, which could be performed multiple times, it is also within the contemplated scope of the present disclosure that different radiation treatment operations 310 (i.e. having differing process parameters such as different wavelengths, different energies, different operation intensities, or operation temperatures, or the like) could be employed at different stages of the method depicted in FIG. 3.

FIGS. 4A to 4F are cross-sectional views of the pixel region 101 and a periphery region 102 in image sensor device 100 at various stages of manufacture according to various embodiments of the method of FIG. 3. Various figures have been simplified for a better understanding of the inventive concepts of the preset disclosure Referring back to FIG. 3, the method 300 proceeds from operation 301 in which a photodetector is formed a in front surface a substrate.

Figure 4A:
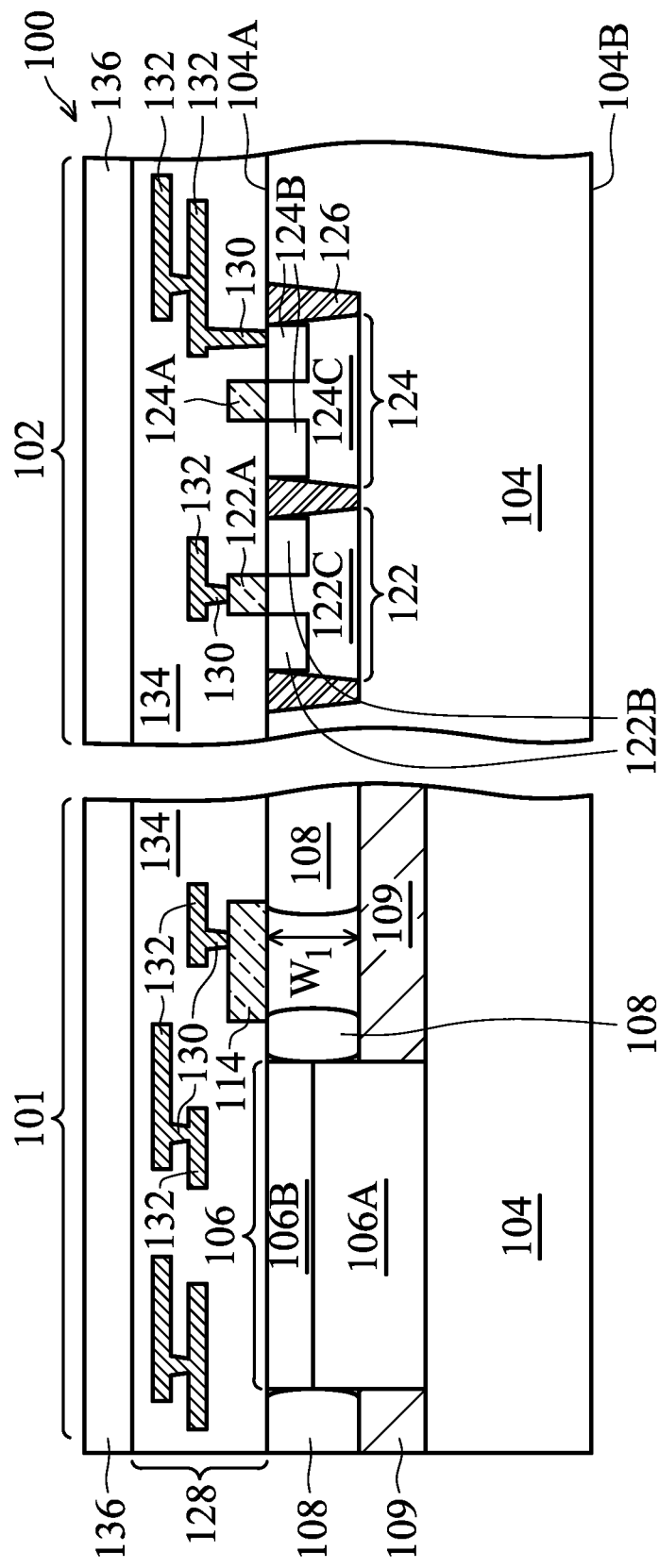
FIGS. 4A to 4F are cross-sectional views of the image sensor device in FIG. 2 at various stages of manufacture according to various embodiments of the method of FIG. 3.

FIG. 4A is a cross-sectional view of the pixel region 101 along line B-B' in FIG. 2 and the periphery region 102 in the image sensor device 100 after performing operation 301. The image sensor device 100 includes a substrate 104 having a front surface 104A and a back surface 104B. In the depicted embodiment, the substrate 104 is a semiconductor substrate including silicon. Alternatively or additionally, the substrate 104 includes another elementary semiconductor, such as germanium and/or diamond; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 104 may be a semiconductor on insulator (SOI). The substrate 104 may have various doping configurations depending on design requirements (e.g., p-type substrate or n-type substrate). In some embodiments, the p-type refers to making holes as majority charge carriers in a semiconductor material, and the n-type refers to making electrons as majority charge carriers in a semiconductor material. In the depicted embodiment, the substrate 104 is a p-type substrate. P-type dopants that the substrate 104 is doped with include boron, gallium, indium, other suitable p-type dopants, or combinations thereof.

The pixel region 101 includes at least one photodetector 106 formed adjacent the front surface 104A of the substrate. The at least one photodetector 106, such as a photodiode, includes a light-sensing region 106A and a doped pinned layer 106B. The forming of the light-sensing region 106A may include introducing a first conductivity type of dopants from the front surface 104A of the substrate 104. In the depicted embodiment, the light-sensing region 106A is an n-type doped region. An implantation process may be performed on the light-sensing region 106A with n-type dopants into the substrate 104. The n-type dopants may include phosphorus, arsenic, other suitable n-type dopants or combinations thereof. The doped pinned layer 106B overlaps the light-sensing region 106A at the front surface 104A of the substrate 104. The forming of the doped pinned layer 106B may include introducing a second conductivity type of dopants opposite to the first conductivity type of the light-sensing region 106A from the front surface 104A into the light-sensing region 106A. In the depicted embodiment, the doped pinned layer 106B is a p-type implanted layer. An implantation process may be performed on doped pinned layer 106B with p-type dopants into the substrate 104. The p-type dopants may include boron, gallium, indium, other suitable p-type dopants, or combinations thereof.

The pixel region 101 further includes various transistors, such as the transfer transistor 110 (shown in FIG. 2), the reset transistor 112 (shown in FIG. 2), the source-follower transistor 114 and the select transistor 116 (shown in FIG. 2). Each transistor has a corresponding gate stack disposed over the front surface 104A of the substrate 104. The gate stack of each transistor includes a gate dielectric layer and a gate electrode layer. The gate stacks are formed by suitable processes, including deposition, lithography patterning and etching processes. The gate dielectric layer includes a dielectric material, such as silicon oxide, a high-k dielectric material, other dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy or combinations thereof. The gate electrode layer includes polysilicon and/or a metal including Al, Cu, Ti, Ta, W, Mo, TaN, NiSi, CoSi, TiN, WN, TiAl, TiAlN, TaCN, TaC, TaSiN or combinations thereof.

In some embodiments, the pixel region 101 includes an isolation well 109 underlying the gate stack of each transistor. A top surface of the isolation well 109 is under the front surface 104A with a distance $W_1$. The distance $W_1$ is in a range from about 1000 Å to about 3000 Å. The isolation well 109 has the second conductivity type opposite to the first conductivity type of the light-sensing region 106A. In the depicted embodiment, the isolation well 109 is a p-type doped region formed by lithography patterning and implantation process. The isolation well 109 surrounds the light-sensing region 106A of photodetector 106.

The periphery region 102 may include readout circuitry and/or control circuitry coupled to the pixel region 101 to provide an operation environment for the pixel region 101. In the depicted embodiment, a PMOS transistor 122 and a NMOS transistor 124 are shown. The PMOS transistor 122 includes a gate stack 122A and source/drain regions 122B having p-type conductivity formed in a n-type well 122C. The NMOS transistor 124 includes a gate stack 124A and source/drain regions 124B having n-type conductivity formed in a p-type well 124C.

The image sensor device 100 further includes a plurality of isolation features 108 formed in substrate 104 of the pixel region 101 and a plurality of dielectric isolation features 126 formed in substrate 104 of the periphery region 102. The isolation features 108 and the dielectric isolation features 126 isolate various regions of the substrate 104 to prevent leakage currents between various regions. In the depicted embodiment, the isolation features 108 and the dielectric isolation features 126 isolate the PMOS transistor 122 and the NMOS transistor 124, the photodetector 106, the transfer transistor 110 (shown in FIG. 2), the reset transistor 112 (shown in FIG. 2), the source-follower transistor 114 and the select transistor 116 (shown in FIG. 2).

The dielectric isolation features 126 in the periphery region 102 include silicon oxide, silicon nitride, silicon oxynitride, other insulating material, or combination thereof. Each of the dielectric isolation features 126 extends from the front surface 104A into the substrate 104. The formation of dielectric isolation features 126 may include a photolithography process, an etching process to etch a trench from the front surface 104A into the substrate 104 and a deposition process to fill the trench (for example, by using a chemical vapor deposition process) with dielectric material.

In some embodiments, the isolation features 108 in the pixel region 101 include dielectric isolation features 108 formed by a shallow trench isolation (STI) technique similar to the technique for forming the dielectric isolation features 126. In certain embodiments, the isolation features 108 in the pixel region 101 may include doped isolation features 108 formed by an implantation technique. Each of the isolation features 108 extends from the front surface 104A into the substrate 104. The doped isolation feature 108 has the second conductivity type, as does the isolation well 109. The doped isolation features 108 and the isolation well 109 surround the light-sensing region 106A of the photodetector 106 to prevent horizontal leakage paths between the photodetector 106 and other regions. In the depicted embodiment, doped isolation feature 108 is a p-type doped region. P-type dopants of the doped isolation feature 108 include boron (B), $BF_2$, gallium, indium, other suitable p-type dopants or combination thereof.

The image sensor device 100 further includes a multilayer interconnect (MLI) 128 disposed over the front surface 104A of the substrate 104, including over the photodetector 106. The MLI 128 is coupled to various components of the image sensor device 100, for example the photodetector 106, such that the various components of the image sensor device 100 are operable to properly respond to illuminated light (imaging radiation). The MLI 128 includes various conductive features 130 and 132, which may be vertical interconnects 130, such as contacts and/or vias 130, and horizontal interconnects 132, such as lines 132. The various conductive features 130 and 132 include conductive materials, such as aluminum, aluminum/silicon/copper alloy, titanium, titanium nitride, tungsten, polysilicon, metal silicide, or combinations thereof.

The various conductive features 130 and 132 of the MLI 128 are interposed in an interlayer dielectric (ILD) layer 134. The ILD layer 134 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), amorphous fluorinated carbon, low-k dielectric material, polyimide, or combinations thereof. The ILD layer 134 may have a multilayer structure.

The image sensor device 100 may further include a carrier wafer 136 disposed over the front surface 104A of the substrate 104. In the depicted embodiment, the carrier wafer 136 is bonded to the MLI 128. The carrier wafer 136 includes silicon or glass. The carrier wafer 136 can provide protection for the various features (such as the photodetector 106) formed on the front surface 104A of the substrate 104, and can also provide mechanical strength and support for processing the back surface 104B of the substrate 104.

Referring back to FIG. 3, the method 300 continues with operation 302. The substrate is thinned from the back surface of the substrate. In at least one embodiment, a planarization process, such as a chemical mechanical polishing (CMP) process, is applied to the back surface of the substrate to reduce a thickness of the substrate.

Figure 4B:
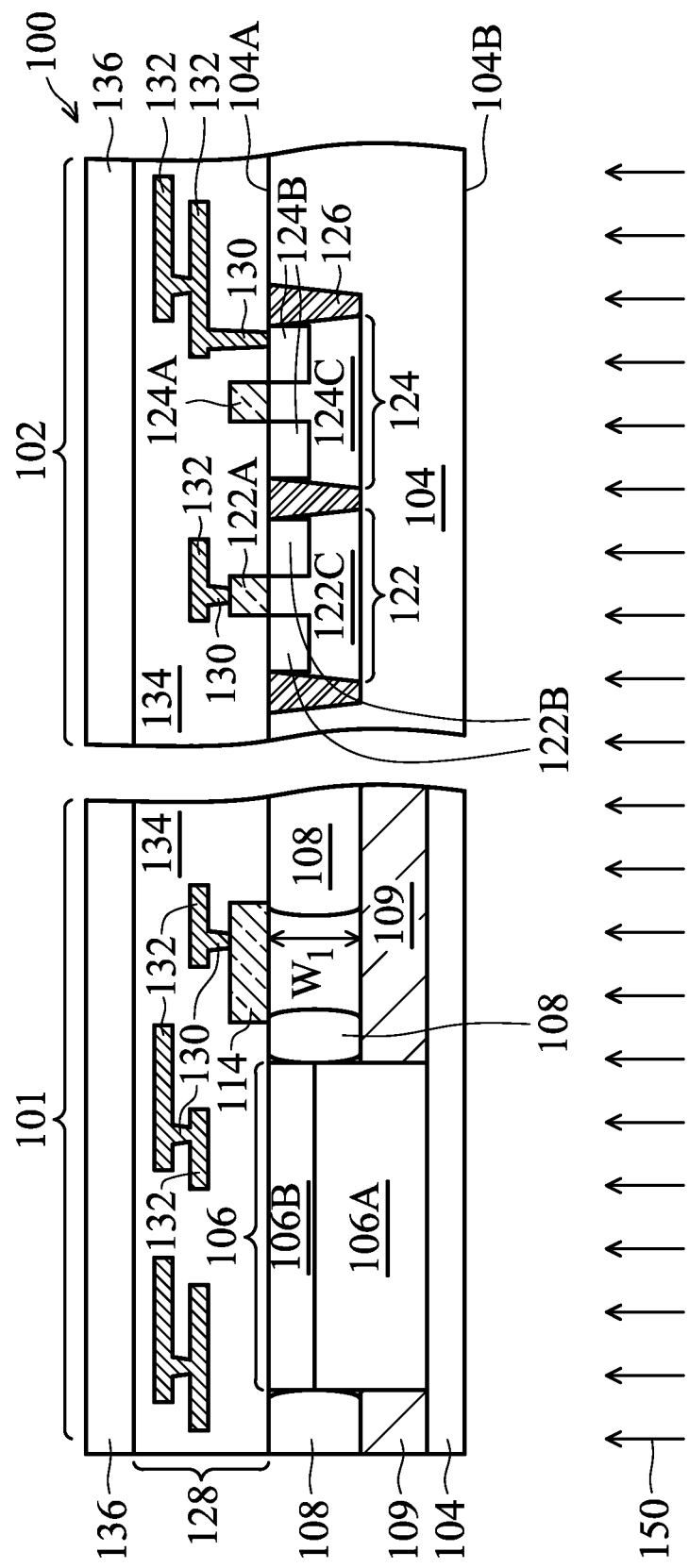

FIG. 4B is a cross-sectional view of the image sensor device 100 after performing operation 302. In some embodiments, the substrate 104 is thinned from the back surface 104A to a thickness in a range from about 1 µm to about 4 µm. The substrate 104 may be thinned by grinding, polishing, and/or chemical etching. The thinned substrate 104 allows more photons to reach the light-sensing region 106A from a back surface 104C of the thinned substrate 104.

Referring back to FIG. 3, the method 300 continues with operation 310 in which an ultraviolet (UV) radiation treatment is optionally performed after operation 302.

FIG. 4B is also the cross-sectional view of the image sensor device 100 while performing operation 310. An ultraviolet (UV) radiation treatment 150 is optionally performed over the back surface 104C of the thinned substrate 104. By applying the UV radiation treatment 150, negative charges may be generated on the back surface 104C of the thinned substrate 104. The negative charges attract the holes in electron-hole pairs from the incident radiation to prevent the re-combination of the electrons and the holes. Hence, the phenomenon of dark current or white pixel is reduced. The device performance is improved.

In some embodiments, the UV radiation treatment 150 has a wavelength ranging from about 200 nm to about 410 nm. With wavelengths out of this rage, the positive charges may not gain enough energy acquired from the UV radiation to surmount the energy barrier for electron exciting. In at least one embodiment, the UV radiation treatment 150 has a wavelength at about 254 nm. The UV radiation treatment 150 includes an operation energy ranging from about 3 joule (J) to about 150 J; an operation intensity ranging from about 35 $mW/cm^2$ to about 70 $mW/cm^2$; and an operation temperature ranging from about 50° C. to about 120° C.

Referring back to FIG. 3, the method 300 continues with operation 303. A plurality of dopants is introduced into the thinned substrate from the back surface.

Figure 4C:
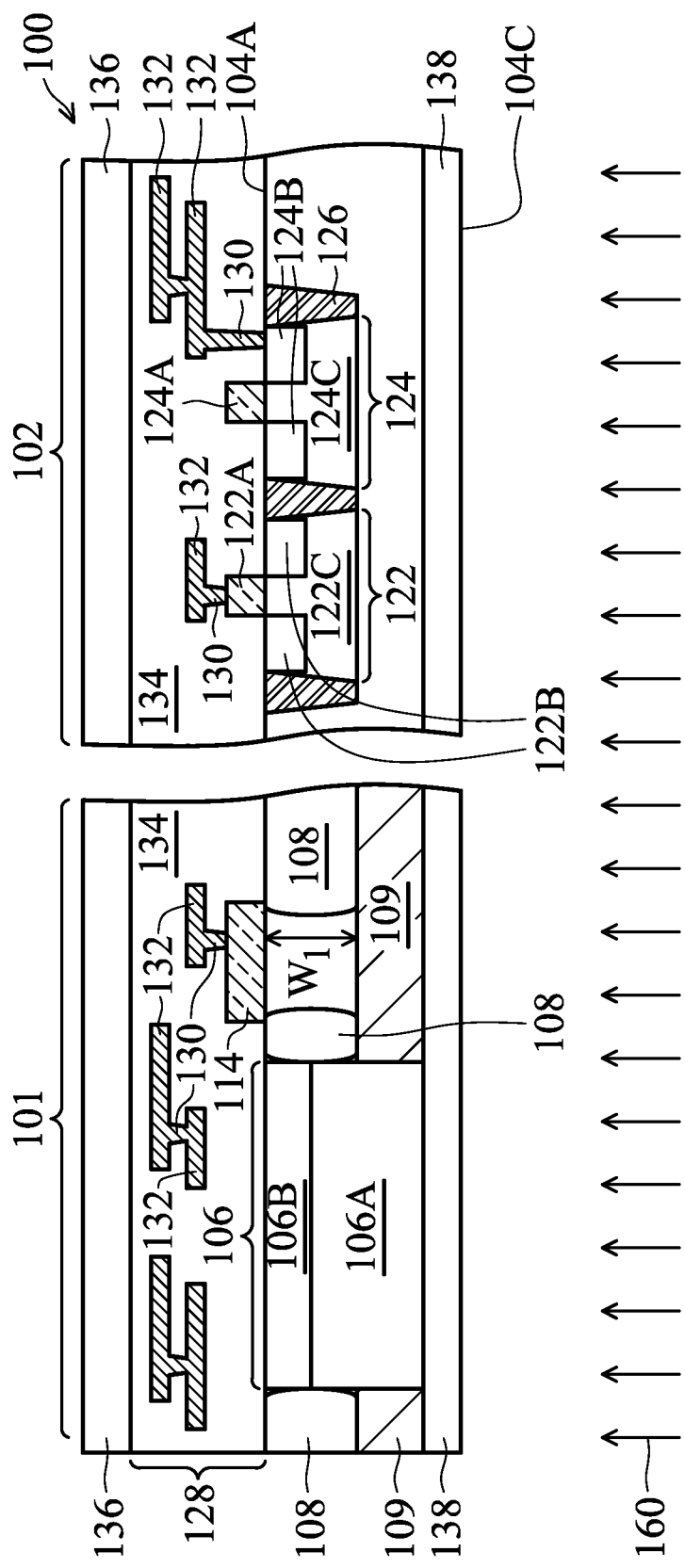

FIG. 4C is a cross-sectional view of the image sensor device 100 while performing operation 303. In some embodiments, a plurality of dopants 160 having the second conductivity type as the doped pinned layer 106B is implanted into the thinned substrate 104 from the back surface 104C to form a doped layer 138. In the depicted embodiment, the doped layer 138 is a p-type layer including one p-type dopant, such as boron, gallium, indium, other suitable p-type dopants, or combinations thereof. In the operation of the image sensor device 100, the light radiation toward the back surface 104C generates electron-hole pairs. The electrons travel toward the light-sensing region 106A and are converted to a signal. The holes are trapped by the doped layer 138 to prevent the re-combination of the electron and the hole. Hence, the quantum efficiency of the image sensor device 100 is increased.

Figure 4D:
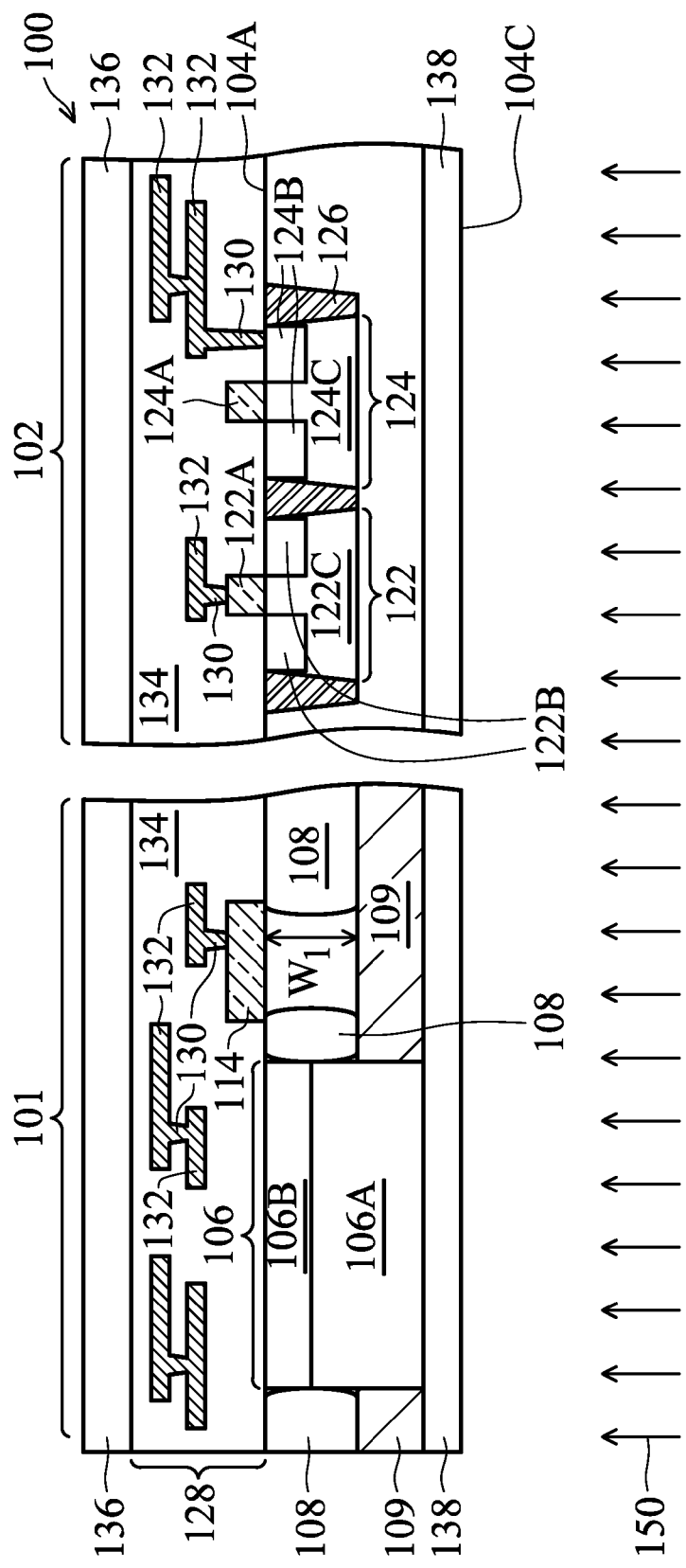

In the certain embodiments, an UV radiation treatment 150 is optionally performed after operation 303 of the method 300 as shown in FIG. 4D.

Referring back to FIG. 3, the method 300 continues with operation 304. An anneal process is performed on the thinned substrate. In some embodiments, a laser annealing process is performed to repair crystal defects caused by the ion implantation of operation 303 and to activate the dopants in operation 303. In the certain embodiments, an UV radiation treatment (operation 310) is optionally performed after operation 304 of the method 300.

Referring back to FIG. 3, the method 300 continues with operation 305 in which an anti-reflective layer is formed over the back surface of the thinned substrate.

Figure 4E:
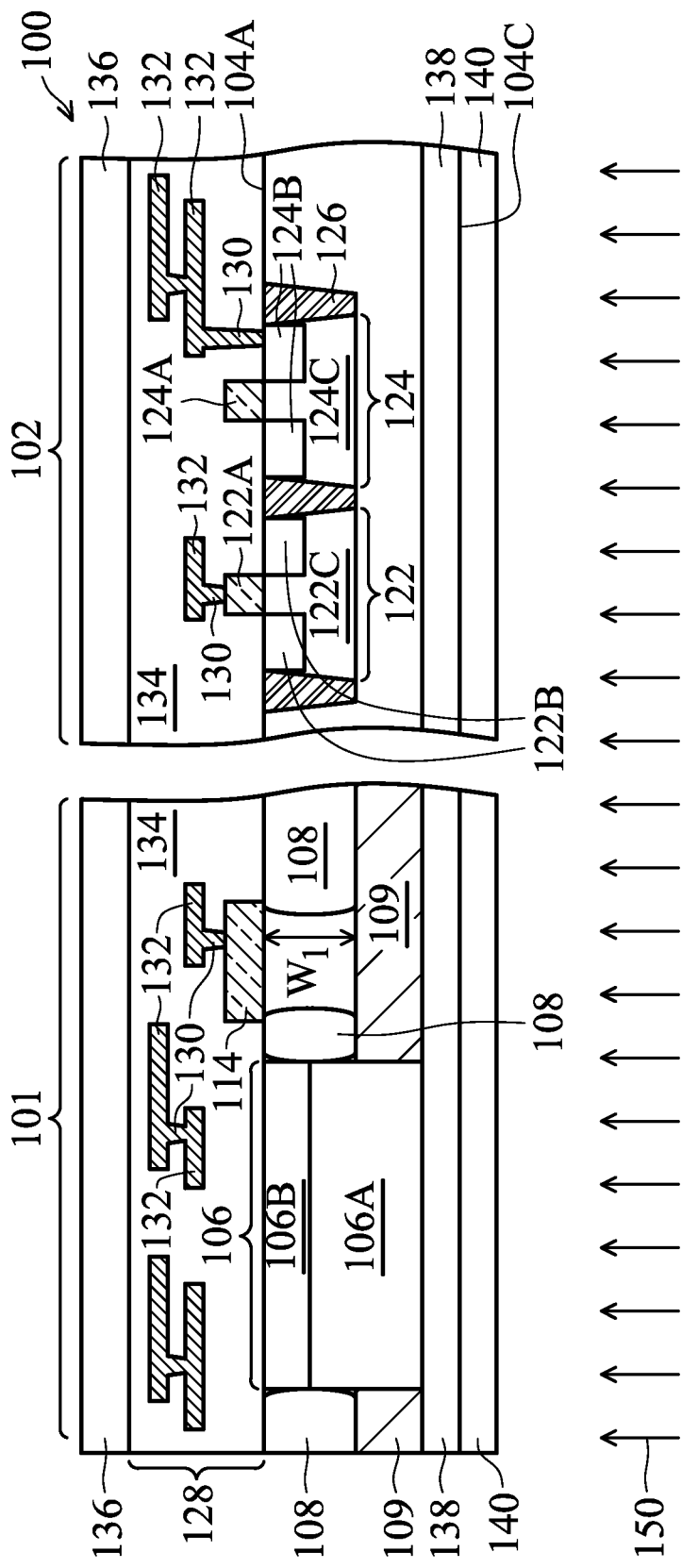

FIG. 4E is a cross-sectional view of the image sensor device 100 after performing operation 305. An anti-reflective layer 140 is deposited over the back surface 104C of the thinned substrate 104. The anti-reflective layer 140 allows light to pass through to the photodiode 106 while minimizing reflection that would decrease the efficiency of the image sensor device 100. The anti-reflective layer 140 may include a dielectric material, such as silicon nitride or silicon oxynitride.

In the certain embodiments, an UV radiation treatment 150 is optionally performed after operation 305 of the method 300 as shown in FIG. 4E.

Referring back to FIG. 3, the method 300 continues with operation 306 in which a micro lens is formed over the anti-reflective layer.

Figure 4F:
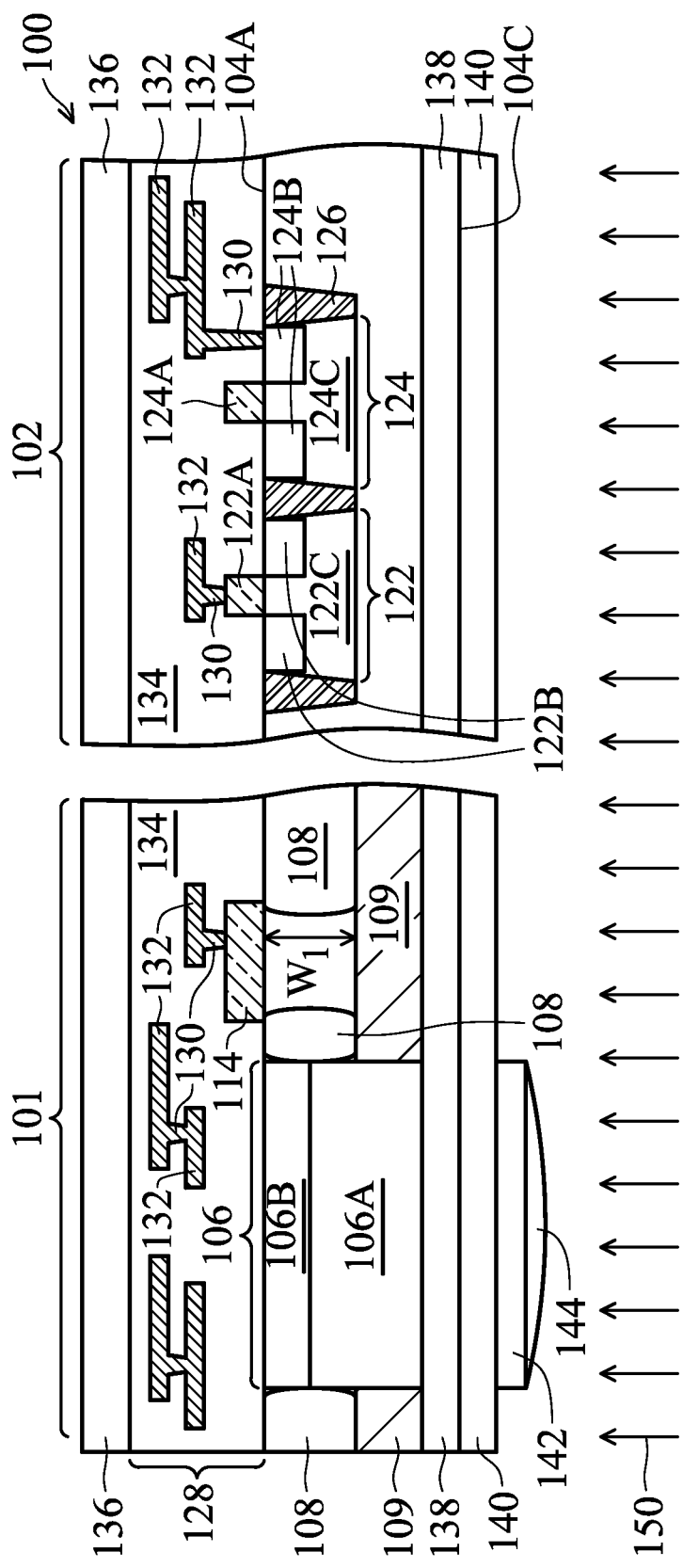

FIG. 4F is a cross-sectional view of the image sensor device 100 after performing operation 306. A color filter 142 and a lens 144 are formed over the back surface 104C of the substrate 104. The color filter 142 is formed over the antireflective layer 140, and is substantially aligned with the light-sensing region 106A of the photodetector 106. The color filter 142 is configured to pass through light of a predetermined wavelength. For example, the color filter 142 may pass through visible light of a red wavelength, a green wavelength, or a blue wavelength to the photodetector 106. In an example, the color filter 142 includes a dye-based (or pigment-based) polymer for filtering out a specific frequency band (for example, a desired wavelength of light).

The lens 144 is formed over the color filter 142 and is also substantially aligned with the light-sensing region 106A of the photodetector 106. The lens 144 may be in various positional arrangements with the photodetector 106 and color filter 142, such that the lens 144 focuses incident radiation 146 on the light-sensing region 106A of the photodetector 106. Alternatively, the position of the color filter layer 142 and the lens 144 may be reversed, such that the lens 144 is disposed between the antireflective layer 140 and color filter 142.

In the certain embodiments, an UV radiation treatment 150 is optionally performed after the formation of the lens 144 as shown in FIG. 4F.

In the above depicted embodiments, image sensor device 100 includes a p-type doped substrate 104. Various doping configurations for various features, such as the light-sensing regions 106A, the doped isolation feature 108, the isolation well region 109 and the doped layer 138, described above should be read consistent with the formation of the image sensor device 100 with a p-type doped substrate. Alternatively, image sensor device 100 may include a n-type doped substrate 104 or an n-type material in the substrate 104. Various doping configurations for various features described above should be read consistent with the formation of the image sensor device 100 with a n-type doped substrate.

One aspect of the disclosure describes a method of forming an image sensor device. At step a, a photodetector is formed in a front surface of a substrate. At step b, the substrate is thinned from a back surface of the substrate. At step c, a plurality of dopants is introduced into the thinned substrate from the back surface. At step d, the plurality of dopants in the thinned substrate is annealed. At step e, an anti-reflective layer is deposited over the back surface of the thinned substrate. At step f, a micro lens is formed over the anti-reflective layer. At step g, at least one ultraviolet (UV) radiation treatment is performed after the steps of b, c, d, e or f.

A further aspect of the disclosure describes a method of forming an image sensor device. A photodetector is formed in a front surface of a substrate. The substrate is thinned from a back surface of the substrate. A plurality of dopants is introduced into the substrate from the back surface. An ultraviolet (UV) radiation treatment is performed after introducing the plurality of dopants. The substrate is annealed. An anti-reflective layer is deposited over the back surface of the substrate. A micro lens is formed over the anti-reflective layer.

Another aspect of the disclosure describes a method of forming an image sensor device. At step a, a photodetector is formed in a front surface of a substrate. At step b, the substrate is polished from a back surface of the substrate. At step c, p-type dopants are introduced into the polished substrate from the back surface. At step d, the p-type dopants in the polished substrate are laser annealed. At step e, an anti-reflective layer is deposited over the polished substrate after the laser annealing. At step f, a color filter is formed over the anti-reflective layer. The color filter substantially aligns with the photodetector. At step g, a micro lens is formed over the anti-reflective layer. At step h, at least one ultraviolet (UV) radiation treatment is performed after the steps of b, c, d, e, f or g.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an image sensor device, the method comprising:
   a. forming a photodetector in a front surface of a substrate;
   b. thinning the substrate from a back surface of the substrate;
   c. introducing dopants into the thinned substrate from the back surface;
   d. annealing the thinned substrate;
   e. depositing an anti-reflective layer over the back surface of the thinned substrate;
   f. forming a micro lens over the anti-reflective layer; and
   g. performing at least one ultraviolet (UV) radiation treatment after at least one of the steps of b, c, d, e or f releasing positive charges accumulated along a back surface of the substrate, the at least one UV radiation treatment is performed at an operation energy from about 3 joule to about 150 joule.

2. The method of claim 1, wherein the at least one UV radiation treatment is performed at a wavelength ranging from about 200 nm to about 410 nm.

3. The method of claim 1, wherein the at least one UV radiation treatment is performed more than once.

4. The method of claim 1, wherein the at least one UV radiation treatment is performed only once after the step f.

5. The method of claim 1, wherein the step c. of introducing dopants includes implanting p-type dopants into the substrate.

6. The method of claim 5, wherein the p-type dopants include boron, gallium or indium.

7. The method of claim 1, further comprising: forming an isolation well surrounding the photodetector.

8. The method of claim 1, further comprising:
   forming doped isolation features surrounding the photodetector.

9. A method of forming an image sensor device, the method comprising:
   forming a photodetector in a front surface of a substrate;
   thinning the substrate from a back surface of the substrate;
   introducing dopants into the substrate from the back surface;
   releasing positive charges accumulated along a back surface of the substrate by performing an ultraviolet (UV) radiation treatment after introducing the dopants;
   annealing the substrate;
   depositing an anti-reflective layer over the back surface of the substrate; and
   forming a micro lens over the anti-reflective layer.

10. The method of claim 9, wherein the UV radiation treatment is performed at a wavelength ranging from about 200 nm to about 410 nm.

11. The method of claim 9, wherein the UV radiation treatment is performed at an operation energy ranging from about 3 joule to about 150 joule.

12. The method of claim 9, wherein the UV radiation treatment is performed at an operation intensity ranging from about 35 mV/cm2 to about 70 mV/cm2.

13. The method of claim 9, wherein the dopants have a same conductivity type as the substrate.

14. The method of claim 9, further comprising:
forming doped isolation features surrounding the photodetector.

15. The method of claim 9, further comprising forming a color filter between the anti-reflective layer and the micro lens.

16. A method of forming an image sensor device, the method comprising:
 a. forming a photodetector in a front surface of a substrate;
 b. polishing the substrate from a back surface of the substrate;
 c. introducing p-type dopants into the polished substrate from the back surface;
 d. laser annealing the polished substrate;
 e. depositing an anti-reflective layer over the polished substrate after the laser annealing;
 f. forming a color filter over the anti-reflective layer, wherein the color filter substantially aligns with the photodetector;
 g. forming a micro lens over the anti-reflective layer; and
 h. performing at least one ultraviolet (UV) radiation treatment after at least one of the steps of b, c, d, e, f or g, the performing the at least one UV radiation treatment releasing positive charges.

17. The method of claim 16, wherein the at least one UV radiation treatment is performed at a wavelength ranging from about 200 nm to about 410 nm.

18. The method of claim 16, wherein the at least one UV radiation treatment is performed more than once.

19. The method of claim 16, wherein the at least one UV radiation treatment is performed after both steps c and g.

* * * * *

UNITED STATES PATENT AND TRADEMARK OFFICE
CERTIFICATE OF CORRECTION

PATENT NO. : 8,628,990 B1  
APPLICATION NO. : 13/629317  
DATED : January 14, 2014  
INVENTOR(S) : Cheng-Ta Wu et al.

Page 1 of 1

It is certified that error appears in the above-identified patent and that said Letters Patent is hereby corrected as shown below:

In the Claims

In Col. 11, line 9, claim 12, delete "35 mV/cm2 to about 70 mV/cm2" and insert --35 $mW/cm^2$ to about 70 $mW/cm^2$--.

Signed and Sealed this  
Fifteenth Day of April, 2014

Michelle K. Lee  
*Deputy Director of the United States Patent and Trademark Office*